(12) United States Patent
Park

(10) Patent No.: US 9,899,458 B2
(45) Date of Patent: Feb. 20, 2018

(54) ORGANIC LIGHT-EMITTING DISPLAY DEVICE AND METHOD OF MANUFACTURING THE SAME

(71) Applicant: Samsung Display Co., Ltd., Yongin, Gyeonggi-Do (KR)

(72) Inventor: Jiryun Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/993,764

(22) Filed: Jan. 12, 2016

(65) Prior Publication Data

US 2016/0300894 A1  Oct. 13, 2016

(30) Foreign Application Priority Data

Apr. 8, 2015  (KR) .................. 10-2015-0049950

(51) Int. Cl.
*H01L 27/32* (2006.01)
*H01L 51/52* (2006.01)

(52) U.S. Cl.
CPC ...... *H01L 27/3246* (2013.01); *H01L 27/3258* (2013.01); *H01L 51/525* (2013.01)

(58) Field of Classification Search
CPC ............ H01L 27/3246; H01L 27/3244; H01L 27/3248; H01L 27/3295; H01L 27/3258; H01L 51/525; G02F 1/13394; G02F 2001/13396; H05B 33/22; H05B 33/0896
USPC .................. 257/40, 59, 72, 88–93, E51.018; 313/498–512; 349/155, 156
See application file for complete search history.

(56) References Cited

U.S. PATENT DOCUMENTS

| 8,067,770 B2 | 11/2011 | Ha et al. |
| 8,772,824 B2 | 7/2014 | Lee et al. |
| 8,860,299 B2 | 10/2014 | Seong |
| 8,866,379 B2 | 10/2014 | Jang |

(Continued)

FOREIGN PATENT DOCUMENTS

| KR | 10-2008-0049910 A | 6/2008 |
| KR | 10-2010-0006413 A | 1/2010 |

(Continued)

OTHER PUBLICATIONS

Seo et al, "Organic Light Emitting Device and Method for fabricating the same", translation into English of Unexamined Publication No. KR 1020080049910 (May 6, 2008), from K-PION (Korean Patent Information Online Network), website http://kposd.kipo.go.kr:8088/up/kpion/.*

*Primary Examiner* — Johannes P Mondt
(74) *Attorney, Agent, or Firm* — H.C. Park & Associates, PLC

(57) ABSTRACT

An organic light-emitting display device comprises: a substrate; a thin film transistor (TFT) disposed on the substrate; a protection film disposed on the substrate so as to cover the TFT and including a hole; a pixel electrode disposed on the protection film so as to cover an inner surface of the hole, and electrically connected to the TFT; a pixel-defining film disposed on the pixel electrode and the protection film and including an opening that exposes a part of the pixel electrode; and first and second spacers disposed on the pixel-defining film. The first spacer is disposed so as to correspond to the hole, and a height of the second spacer is higher than a height of the first spacer.

13 Claims, 6 Drawing Sheets

(56) References Cited

U.S. PATENT DOCUMENTS

| | | |
|---|---|---|
| 8,895,982 B2 | 11/2014 | Kim et al. |
| 8,991,461 B2 | 3/2015 | Kim |
| 2003/0168966 A1* | 9/2003 | Kobayashi .......... H01L 27/3246 |
| | | 313/495 |
| 2010/0171416 A1 | 7/2010 | Lee |
| 2013/0023617 A1 | 6/2013 | Okamoto |

FOREIGN PATENT DOCUMENTS

| | | |
|---|---|---|
| KR | 10-2010-0081774 A | 7/2010 |
| KR | 10-2013-0008530 A | 1/2013 |

\* cited by examiner

ORGANIC LIGHT-EMITTING DISPLAY DEVICE AND METHOD OF MANUFACTURING THE SAME

CLAIM OF PRIORITY

This application claims priority to and claims all benefits accruing under 35 U.S.C. § 119 from Korean Patent Application No. 10-2015-0049950, filed on Apr. 8, 2015 in the Korean Intellectual Property Office, the disclosure of which is incorporated herein in its entirety by reference.

BACKGROUND OF THE INVENTION

Field of the Invention

The present invention relates to an organic light-emitting display device and a method of manufacturing the organic light-emitting display device.

Description of the Related Art

An organic light-emitting display device generally includes a hole injection electrode, an electron injection electrode, and an organic light-emitting device which is disposed between the hole injection electrode and the electron injection electrode and which includes an organic emission layer. The organic light-emitting display device is a self-emitting display device in which light is generated when excitons, generated when holes emitted from the hole injection electrode and electrons emitted from the electron injection electrode are combined in the organic emission layer, change from an excited state to a ground state.

Organic light-emitting display devices, which are self-emitting display devices, do not require an additional light source, and thus may be driven with a low voltage and manufactured to be light and thin. Also, the organic light-emitting display devices have high-quality characteristics such as wide viewing angles, high contrast, and high response rates, and thus have drawn attention as next-generation display devices.

An organic light-emitting display device comprises a display substrate including an organic light-emitting device and an encapsulation substrate disposed to face the display substrate. In this regard, if a space between the display substrate and the encapsulation substrate is extremely narrow, the organic light-emitting display device may be vulnerable to external shock, and the display quality thereof may deteriorate.

SUMMARY OF THE INVENTION

One or more exemplary embodiments of the present invention comprise an organic light-emitting display device for preventing the deterioration of display quality due to external shock and a method of manufacturing the organic light-emitting display device.

Additional aspects will be set forth in part in the description which follows and, in part, will be apparent from the description, or may be learned by practice of the presented embodiments.

According to the present invention, an organic light-emitting display device comprises: a substrate; a thin film transistor (TFT) disposed on the substrate; a protection film disposed on the substrate so as to cover the TFT and including a hole; a pixel electrode disposed on the protection film so as to cover an inner surface of the hole and electrically connected to the TFT; a pixel-defining film disposed on the pixel electrode and the protection film and including an opening that exposes a part of the pixel electrode; and first and second spacers disposed on the pixel-defining film, wherein the first spacer is disposed to correspond to the hole, and a height of the second spacer is higher than that of the first spacer.

The first spacer may be disposed directly above the hole.

The first spacer may have an island shape.

The first and second spacers may include the same material as that of the pixel-defining film and are integrated with the pixel-defining film.

The pixel-defining film and the first and second spacers may include photoresist.

The pixel-defining film and the first and second spacers may include an organic material.

According to the present invention, a method of manufacturing an organic light-emitting display device comprises: preparing a substrate; forming a thin film transistor (TFT) on the substrate; forming a protection film on the substrate so as to cover the TFT; forming a hole in the protection film sp as to expose a part of the TFT; forming a pixel electrode on the protection film so as to cover an inner surface of the hole, the pixel electrodes being electrically connected to the TFT through the hole; forming a pixel-defining film forming layer on the substrate so as to cover the pixel electrode and the protection film; exposing the pixel-defining film forming layer using a halftone mask; and developing the exposed pixel-defining film forming layer and forming a pixel-defining film including an opening that exposes a part of the pixel electrode and first and second spacers on the pixel-defining film. The forming of the first and second spacers includes: forming the first spacer in an area corresponding to the hole in the protection film, and forming a height of the second spacer so as to be higher than that of the first spacer.

The first spacer may be disposed directly above the hole in the protection film.

The first spacer may have an island shape.

The pixel-defining film forming layer may include a dent area having a sunken surface.

The dent area may be disposed directly above the hole.

The pixel-defining film forming layer may include an organic material.

BRIEF DESCRIPTION OF THE DRAWINGS

These and/or other aspects will become apparent and more readily appreciated from the following description of the exemplary embodiments, taken in conjunction with the accompanying drawings, in which.

DETAILED DESCRIPTION

Figure 1:
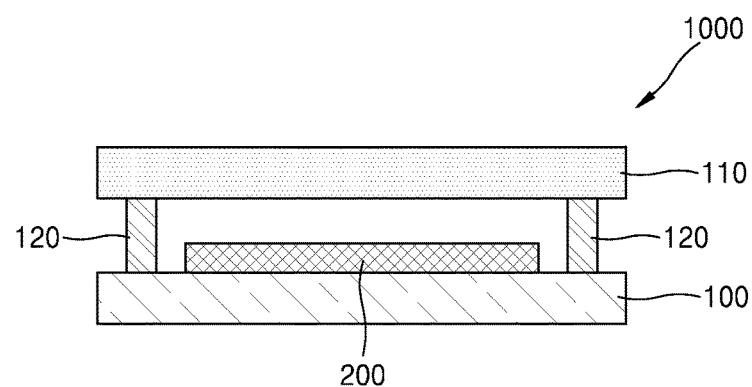
FIG. 1 is a schematic perspective view of an organic light-emitting display device according to an exemplary embodiment of the invention.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. It would be obvious to those of ordinary skill in the art that exemplary embodiments are to cover all modifications, equivalents, and alternatives falling within the scope of the present invention. In the following description, well-known functions or constructions are not described in detail if it is determined that they would obscure the invention due to unnecessary detail.

It will be understood that, although the terms "first", "second", etc. may be used herein to describe various components, these components should not be limited by these terms. These terms are only used to distinguish one component from another.

It will be understood that, when a layer, region, or component is referred to as being "formed on" another layer, region, or component, it can be directly or indirectly formed on the other layer, region, or component. That is, for example, intervening layers, regions, or components may be present.

Hereinafter, exemplary embodiments of the invention will be described in detail with reference to the accompanying drawings. In the drawings, components that are substantially the same or that correspond to each other will be denoted by the same reference numeral and will not be redundantly described. In the drawings, elements may be exaggerated, omitted, or schematically illustrated for convenience of explanation. In other words, since sizes and thicknesses of components in the drawings are arbitrarily illustrated for convenience of explanation, the following embodiments are not limited thereto. As used herein, the term "and/or" includes any and all combinations of one or more of the associated listed items. Expressions such as "at least one of," when preceding a list of elements, modify the entire list of elements and do not modify the individual elements of the list.

Figure 2:
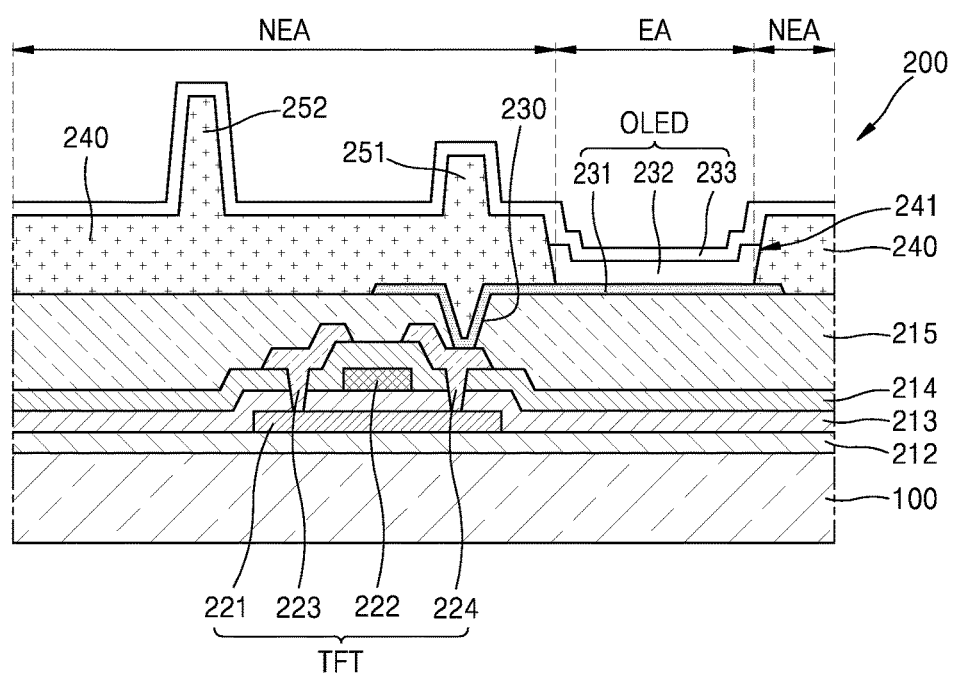
FIG. 2 is a schematic enlarged view of a pixel of FIG. 1.

FIG. 1 is a schematic perspective view of an organic light-emitting display device according to an exemplary embodiment of the invention, and FIG. 2 is a schematic enlarged view of a pixel of FIG. 1.

Referring to FIGS. 1 and 2, the organic light-emitting display device 1000 according to an exemplary embodiment of the invention may include a first substrate 100, a thin film transistor (TFT), a protection film 215 including a hole 230, a pixel electrode 231, a pixel-defining film 240, and a plurality of spacers 251 and 252.

When the organic light-emitting display device 1000 is a bottom emission-type display device in which a display image is recognized outside through the first substrate 100, the first substrate 100 may be formed of a transparent glass material having $SiO_2$ as a main component. However, the first substrate 100 is not necessarily limited thereto. The first substrate 100 may be formed of a transparent plastic material. The plastic material used to form the first substrate 100 may be an insulating organic material selected from the group consisting of polyethersulphone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (TAC), and cellulose acetate propionate (CAP).

Conversely, when the organic light-emitting display device 1000 is a top emission-type display device in which the display image is formed in a direction opposite to the first substrate 100, the first substrate 100 need not be formed of a transparent material. For example, the first substrate 100 may be formed of a metal. When the first substrate 100 is formed of a metal, the first substrate 100 may include one or more materials selected from the group consisting of C, Fe, Cr, Mn, Ni, Ti, Mo, stainless steel (SUS), an invar alloy, an inconel alloy, and a kovar alloy, but it is not limited thereto.

The organic light-emitting display device 1000 may further include a second substrate 110 disposed to face the first substrate 100. The second substrate 110 may protect a display unit 200 from external shock by covering the display unit 200 formed on the first substrate 100. The second substrate 110, like the first substrate 100, may be formed of various materials depending on a direction in which light is emitted. Alternatively, the organic light-emitting display device 1000 may be modified in various ways so as to include, instead of the second substrate 110, an encapsulation film in which organic films and inorganic films are alternately disposed so as to cover devices on the first substrate 100.

The first substrate 100 and the second substrate 110 may be bonded to each other by a sealing unit 120. The sealing unit 120 may be disposed so as to surround the display unit 200 between the first substrate 100 and the second substrate 110. A space between the first substrate 100 and the second substrate 110 is sealed by the sealing unit 120, thereby preventing external moisture, air, and other impurities from penetrating into the display unit 200 disposed in the space.

The TFT of FIG. 2 may be disposed on the first substrate 100. The TFT may be electrically connected to an organic light-emitting device (OLED) as to provide an image that a user may recognize. A detailed description of the TFT will be described in detail with reference to FIG. 3 later.

The protection film 215 may be disposed so as to cover the TFT on the first substrate 100. The protection film 215 may include the hole 230 through which the TFT is electrically connected to the pixel electrode 231 of the OLED so as to apply an electrical signal to the OLED. Although the pixel electrode 231 is connected to a drain electrode 224 of the TFT in FIG. 2, the pixel electrode 231 may be connected to a source electrode 223 instead of the drain electrode 224. Thus, the hole 230 may be formed in the protection film 215 so as to expose a part of the drain electrode 224 or the source electrode 223 of the TFT.

The protection film 215 may include an inorganic insulating material and/or an organic insulating material. The inorganic insulating material may include $SiO_2$, $SiN_x$, SiON, $Al_2O_3$, $TiO_2$, $Ta_2O_5$, $HfO_2$, $ZrO_2$, BST, and PZT. The organic insulating material may include a general-purpose polymer such as polymethyl methacrylate (PMMA) or polystyrene (PS), a polymeric derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a mixture thereof. The protection film 215 may be formed as a composite stack structure including an inorganic insulating film and an organic insulating film.

The protection film 215 may protect the TFT and also planarize one surface of the first substrate 100, which is uneven due to the TFT formed on the protection film 215.

The pixel electrode 231 may be disposed on the protection film 215 and may be formed to cover an inner surface of the hole 230 included in the protection film 215. The pixel electrode 231 may cover the entire inner surface of the hole 230. However, the pixel electrode 231 may cover a part of the inner surface of the hole 230 as long as the pixel electrode 231 may be properly connected to the drain electrode 224 or the source electrode 223 of the TFT.

The pixel electrode 231 may be formed as a semi-transparent electrode or a reflective electrode. When the pixel electrode 231 is formed as a semi-transparent electrode, the pixel electrode 231 may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). When the pixel electrode 231 is formed as a reflective electrode, the pixel electrode 231 may include a reflective film formed of Ag, Mg, Al, Pt, Pd, Au, Ni, Nd, Jr, Cr, or a combination thereof, and a semi-transparent electrode layer formed on the reflective film.

The pixel-defining film 240 may be disposed on the pixel electrode 231 and the protection film 215. The pixel-defining film 240 may include an opening 241 exposing a part of the pixel electrode 231. An intermediate layer 232 and an opposing electrode 233 may be disposed in the opening 241. The intermediate layer 232, the opposing electrode 233, and the pixel electrode 231 may constitute the OLED.

Therefore, the pixel-defining film 240 may define an area corresponding to the opening 241 as an emission area EA, and may define an area surrounding the opening 241 as a non-emission area NEA. That is, a portion in which the pixel-defining film 240 is formed may be the non-emission area NEA, and a portion in which the opening 241 of the pixel-defining film 240 is formed and the pixel electrode 231 is exposed may be the emission area EA. The pixel-defining film 240 may define the emission area EA and the non-emission area NEA, and thus may have a height from about 0.5 to about 2 μm.

The plurality of spacers 251 and 252 may be disposed on the pixel-defining film 240, more particularly, the non-emission area NEA in which the pixel-defining film 240 is formed.

The plurality of spacers 251 and 252 may prevent a fine metal mask (FMM) (not shown), formed on the pixel-defining film 240 so as to deposit an organic material, from contacting the pixel-defining film 240. In more detail, the FMM may be spaced apart from the pixel-defining film 240 in order to prevent the FMM from contacting a deposited resultant during a process of depositing an organic light-emitting material included in the intermediate layer 232 in the opening 241 through the FMM. Thus, the organic light-emitting material may be stably deposited in the opening 241, and an area on which the organic light-emitting material is deposited may be the emission area EA so that light may be emitted in a direction toward the second substrate 110 or in an opposite direction relative thereto.

The plurality of spacers 251 and 252 may prevent the second substrate 110 from contacting the OLED on the first substrate 100 by keeping a consistent space between the first substrate 100 and the second substrate 110. In this regard, the plurality of spacers 251 and 252 may or may not contact the second substrate 110.

However, when a plurality of spacers having a same height are disposed, if some spacers collapse due to a strong external shock, the second substrate 110 instantaneously falls on the first substrate 100. Thus, since the second substrate 110 contacts the OLED, a part of an organic deposition material of the OLED may be transferred to the second substrate 110. Thereafter, if the external shock is removed, although the second substrate 110 recovers a space with the OLED again, a location of the second substrate 110 may be slightly distorted from an original location thereof due to the collapsed spacers. For example, if a plane coordinate of one point on the second substrate 110 is (X,Y) before the external shock is applied, the plane coordinate of the point may be changed to (X',Y') after the external shock is removed. Accordingly, when the organic deposition material transferred onto the second substrate 110 is located in or near the emission area EA, an image may be stained when the organic light-emitting display device 1000 forms the image.

To solve this problem, the organic light-emitting display device 1000 of the present embodiment may include the plurality of spacers 251 and 252 having different heights. Among the plurality of spacers 251 and 252, the first spacer 251 is a spacer having a relatively low height, and the second spacer 252 is a spacer having a relatively high height.

The first spacer 251 may be disposed in the non-emission area NEA so as to correspond to the hole 230, more particularly, directly above the hole 230. The first spacer 251 is similar in shape and size to the hole 230 formed in the protection film 215 so that the first spacer 251 may be formed in an island type, like the hole 230.

The second spacer 252 may be disposed in the non-emission area NEA, may be spaced apart from the first spacer 251, and may be higher than the first spacer 251.

As described above, the first spacer 251, having a relatively low height relative to the second spacer 252, is disposed in the non-emission area NEA closer to the emission area EA, thereby preventing the second substrate 110 from instantaneously contacting the OLED even when external shock is applied. That is, when a plurality of spacers having the same height are disposed, if some of the spacers collapse, an instantaneous fall of the second substrate 110 may not be supported. However, when the first spacer 251 having a relatively low height is disposed in an area adjacent to the OLED, even though the second spacer 252 having a relatively high height collapses, an instantaneous fall of the second substrate 110 on the OLED may be supplementarily supported.

The second spacer 252 may prevent the FMM from contacting the deposition material in the opening 241. The second spacer 252 may have a height of about 2 μm to about 5 μm from the opening 241. The first spacer 251 may have a height of about 1 μm to about 3 μm from the opening 241 by taking into account the fall of the second substrate 110.

In addition to a difference in height described above, the first spacer 251 may have a different width than that of the second spacer 252. Unlike the first spacer 251, the second spacer 252 may be formed in a strip type, other than the island type. That is, the shapes, numbers, and layout of the first spacer 251 and the second spacer 252 are not limited to those illustrated in FIG. 2, and may be modified in various ways depending on designs.

The pixel-defining film 240 may be integrally formed with the plurality of spacers 251 and 252 by using the same material. In this regard, the pixel-defining film 240 and the plurality of spacers 251 and 252 may be formed through a photo process or a photo etching process. That is, the pixel-defining film 240 may be integrally formed with the plurality of spacers 251 and 252 by adjusting the amount of exposure light through an exposure process that uses a halftone mask. Thus, the pixel-defining film 240 and the plurality of spacers 251 and 252 may be formed of a photoresist (PR) material, more particularly, organic materials such as polyimide, polyacryl, benzocyclobutene (BCB) resin, etc.

A method of manufacturing an organic light-emitting display device, according to an exemplary embodiment, will now be described with reference to FIGS. 3 through 8 below.

FIGS. 3 through 8 are cross-sectional views for sequentially describing a method of manufacturing the pixel of FIG. 1. Redundant descriptions of the elements described above are briefly given or omitted below.

Figure 3:
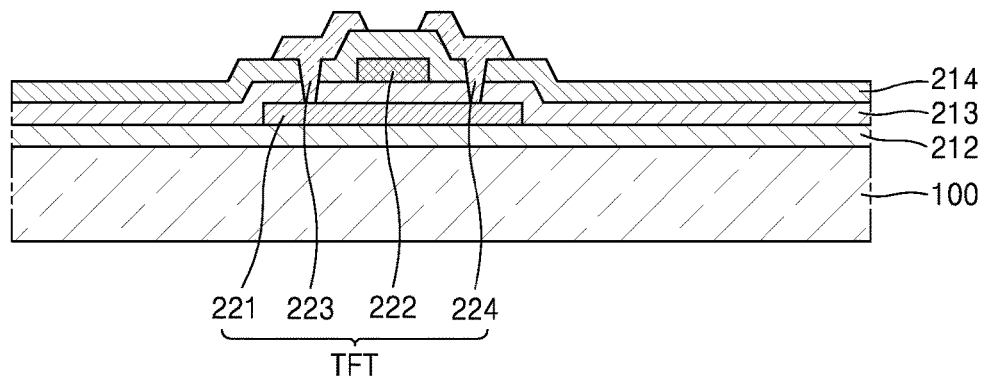
FIGS. 3 thru 8 are cross-sectional views for sequentially describing a method of manufacturing the pixel of FIG. 1.

Referring to FIG. 3, the first substrate 100, on which a TFT and an OLED are to be formed, may be prepared.

A buffer layer 212 may be formed on the first substrate 100. The buffer layer 212 may prevent impure elements from permeating the first substrate 100, may provide a flat surface on the first substrate 100, and may be formed of various materials capable of performing such functions. For example, the buffer layer 212 may include inorganic materials such as silicon oxide (SiOx), silicon nitride (SiNx), silicon oxynitride (SiOxNy), aluminum oxide, aluminum nitride, titanium oxide, titanium nitride, etc. or organic materials such as polyimide, polyester, acryl, etc., and may have a stack structure in which the above materials are stacked.

An active layer 221 may be formed of an inorganic semiconductor material such as silicon or an organic semiconductor material. The active layer 221 may include a source region, a drain region, and a channel region disposed between the source region and drain region. For example, when amorphous silicon is used to form the active layer 221, the active layer 221 including the source region, the drain region, and the channel region disposed between the source region and drain region may be formed by forming and crystallizing an amorphous silicon layer on an entire surface of the substrate 100, forming a polycrystalline silicon layer, patterning the polycrystalline silicon layer, and doping a source region and a drain region in an edge of the polycrystalline silicon layer with impurities.

A gate insulating film 213 may be formed on the active layer 221. The gate insulating film 213 may be used to insulate a gate electrode 222 from the active layer 221, and may be formed of an inorganic material such as SiNx, SiO2, etc.

The gate electrode 222 may be formed on the gate insulating film 213. The gate electrode 222 may be connected to a gate line (not shown) via which an on/off signal is supplied to a TFT.

The gate electrode 222 may contain gold (Au), silver (Ag), copper (Cu), nickel (Ni), platinum (Pt), palladium (Pd), aluminum (Al), and molybdenum (Mo), and may include an alloy such as an Al:Nd alloy, an Mo:W alloy, etc. but is not limited thereto. The gate electrode 222 may be formed of various materials by taking design conditions into account.

An interlayer insulating film 214, formed on the gate electrode 222, may be used to insulate the gate electrode 222, a source electrode 223, and a drain electrode 224 from one another, and may be formed of the inorganic material such as SiNx, SiO2, etc.

The source electrode 223 and the drain electrode 224 may be formed on the interlayer insulating film 214. In more detail, the interlayer insulating film 214 and the gate insulating film 213 may be formed so as to expose the source region and the drain region of the active layer 221, and the source electrode 223 and the drain electrode 224 may be formed so as to contact the exposed source region and the drain region of the active layer 221.

Meanwhile, a top gate-type TFT, in which the gate electrode 222, the source electrode 223, and the drain electrode 224 are sequentially formed in this order, is illustrated in FIG. 2. However, the exemplary embodiments are not limited thereto, and the gate electrode 222 may be disposed below the active layer 221.

Figure 4:
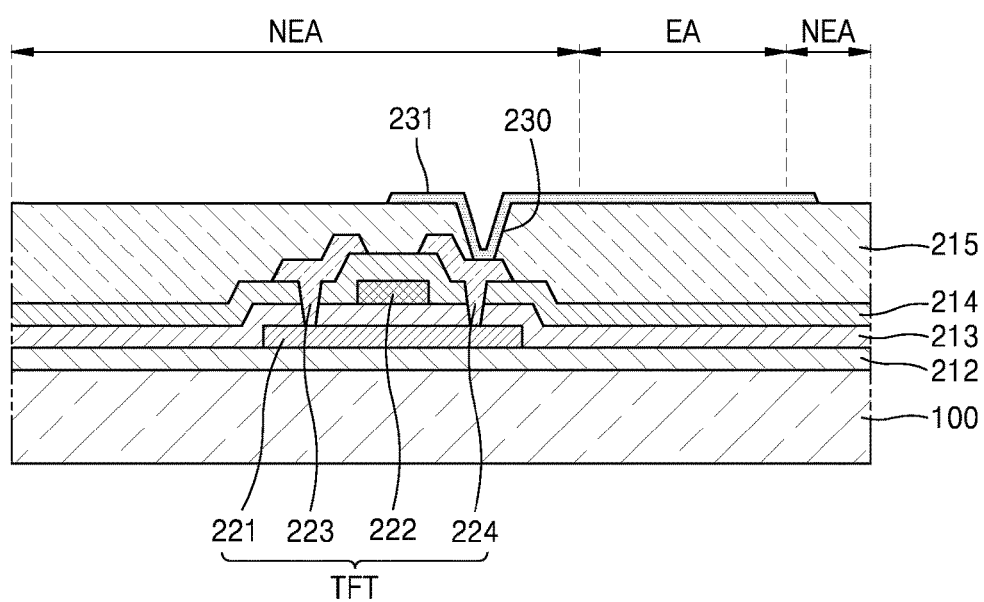

Referring to FIG. 4, the protection film 215 may be formed on the first substrate 100 so as to cover the TFT. The hole 230 may be formed in the protection film 215 so to expose a part of the drain electrode 224 or the source electrode 223 of the TFT.

The pixel electrode 231 may be formed on the protection film 215 so as to cover an inner surface of the hole 230 completely or partially. The pixel electrode 231 may be electrically connected to the drain electrode 224 or the source electrode 223 of the TFT through the hole 230 formed in the protection film 215 so that a driving current applied from the TFT may flow through the OLED.

Figure 5:
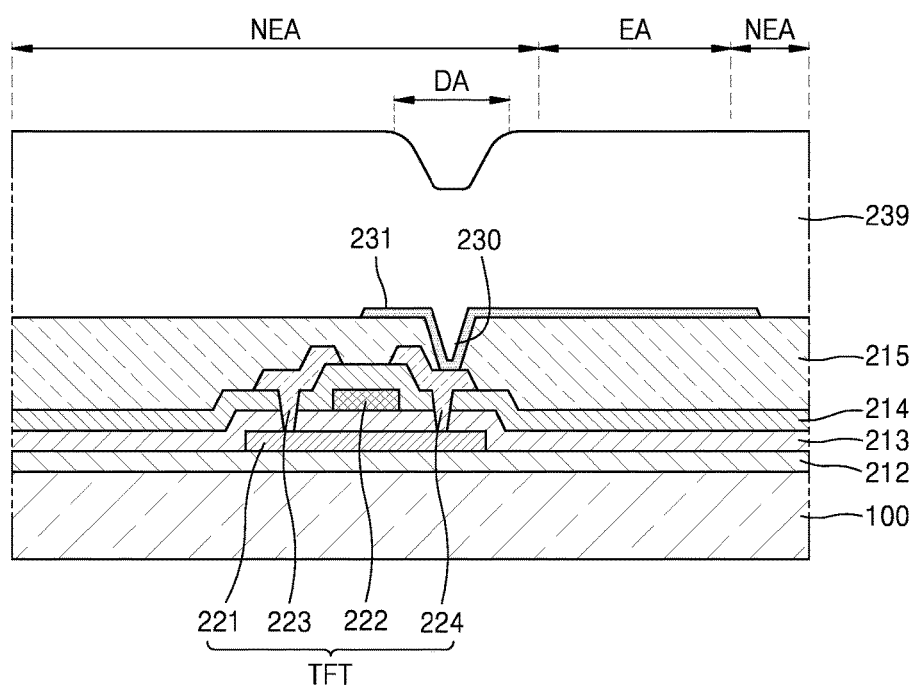

Referring to FIG. 5, a pixel-defining film forming layer 239 may be formed on the first substrate 100 to cover the pixel electrode 231 and the protection film 215. The pixel-defining film forming layer 239 may be a PR layer for integrally forming the pixel-defining film 240 with the plurality of spacers 251 and 252. Thus, the pixel-defining film forming layer 239 may have a height from about 4 μm to about 5 μm by taking into account the heights of the pixel-defining film 240 and the second spacer 252.

The pixel-defining film forming layer 239 may be formed of organic materials such as polyimide, polyacryl, benzocyclobutene (BCB) resin, etc. The pixel-defining film forming layer 239 may be formed on an entire surface of the first substrate 100 using a spin coating method or a nozzle spray method.

The pixel-defining film forming layer 239 may include a dent area DA that may be formed directly above the hole 230 formed in the protection film 215. In general, a planarizing operation may be performed on the pixel-defining film forming layer 239 after the pixel-defining film forming layer 239 is formed on the entire surface of the first substrate 100. However, a lower portion of the pixel-defining film forming layer 239, which corresponds to the hole 230, may sink in spite of the planarizing operation. As described above, the dent area DA that is a sunk portion of the pixel-defining film forming layer 239 may have a higher height than an average height of the pixel-defining film forming layer 239, and thus the dent area DA may be used to form layers having two heights under the same amount of exposure light.

Figure 6:
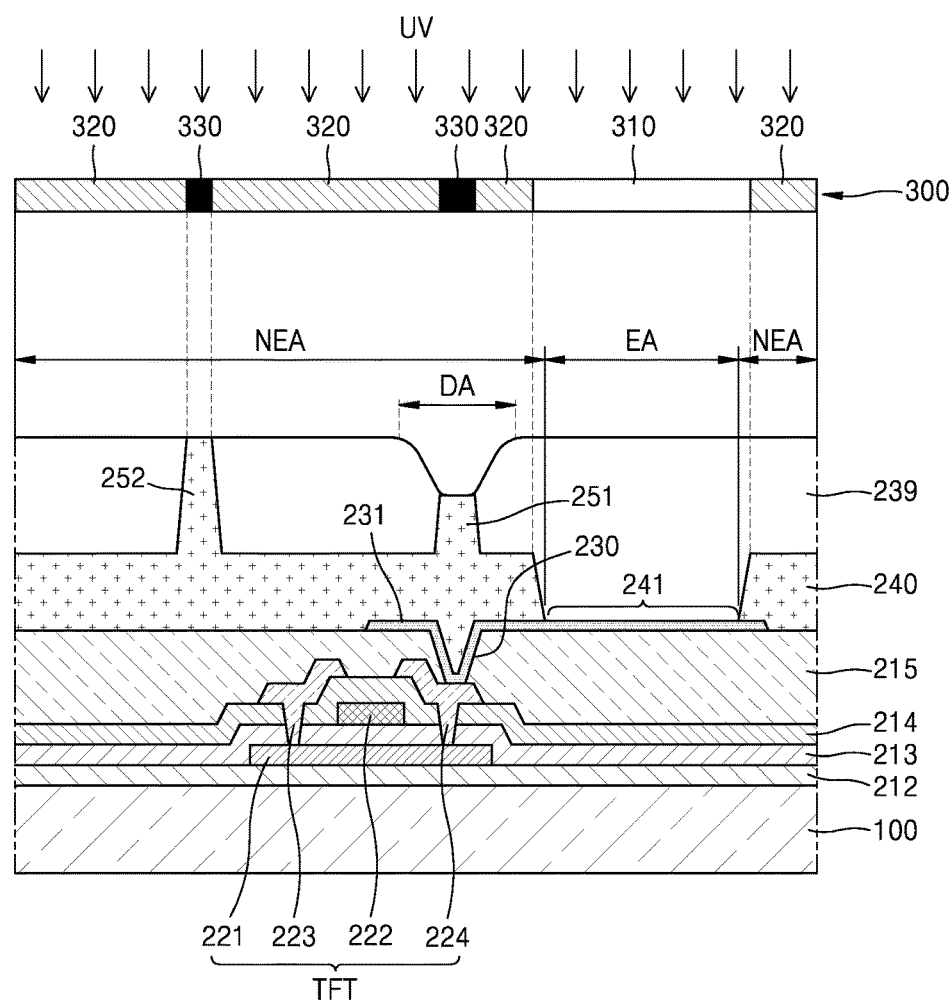

Referring to FIG. 6, a halftone mask 300 may be disposed directly above the pixel-defining film forming layer 239 and then, an exposure process may be performed.

The halftone mask 300 may include three sub-masks, i.e., a complete exposure unit 310, a partial exposure unit 320, and a non-exposure unit 330. The halftone mask 300 may be used to form layers of various thicknesses through a single mask process.

The halftone mask 300 that adjusts the amount of exposure light in three ways described above may basically form three layers. In the present embodiment, the opening 241 may be formed in an area corresponding to the complete exposure unit 310, the pixel-defining film 240 may be formed in an area corresponding to the partial exposure unit 320, and the second spacer 252 may be formed in an area corresponding to the non-exposure unit 330. The non-exposure unit 330 may also be disposed above the dent area DA. A height of the dent area DA may be lower than the average height of the pixel-defining film forming layer 239, and thus the first spacer 251 may be lower than the second spacer 252 under the same non-exposure condition as that for forming the second spacer 252. As illustrated in FIG. 6, each of the first spacer 251 and the second spacer 252 are spaced-apart from opening 241 by a portion of the pixel-defining film 240 external to each of opening 241 and first and second spacers 251 and 252. This portion of pixel-defining film 240 external to each of opening 241 and spacers 251 and 252 corresponds to partial exposure unit 320 that is arranged between complete exposure unit 310 and each of the non-exposure units 330 of half tone mask 300. Thus, layers of four heights, that is, corresponding respectively to opening 241, the portion of pixel-defining film 240 external to each of opening 241 and spacers 251 and 252, the first spacer 251, and the second spacer 252, may be formed in the present embodiment.

The exposure process may be performed by irradiating light such as ultraviolet (UV) rays onto the entire surface of the first substrate 100 on which the halftone mask 300 is disposed. Through the exposure process, the material characteristic of an area of the pixel-defining film forming layer 239 disposed directly below the complete exposure unit 310 may be entirely changed, and the material characteristic of an area of the pixel-defining film forming layer 239 disposed directly below the partial exposure unit 320 may be changed up to a predetermined depth. Although the pixel-defining film forming layer 239 is illustrated as a positive resist in which an exposure unit has solubility with respect to a developing solution in FIG. 6, the pixel-defining film forming layer 239 is not necessarily limited thereto. The pixel-defining film forming layer 239 may be a negative resist in which an exposure unit has insolubility with respect to a developing solution.

Figure 7:
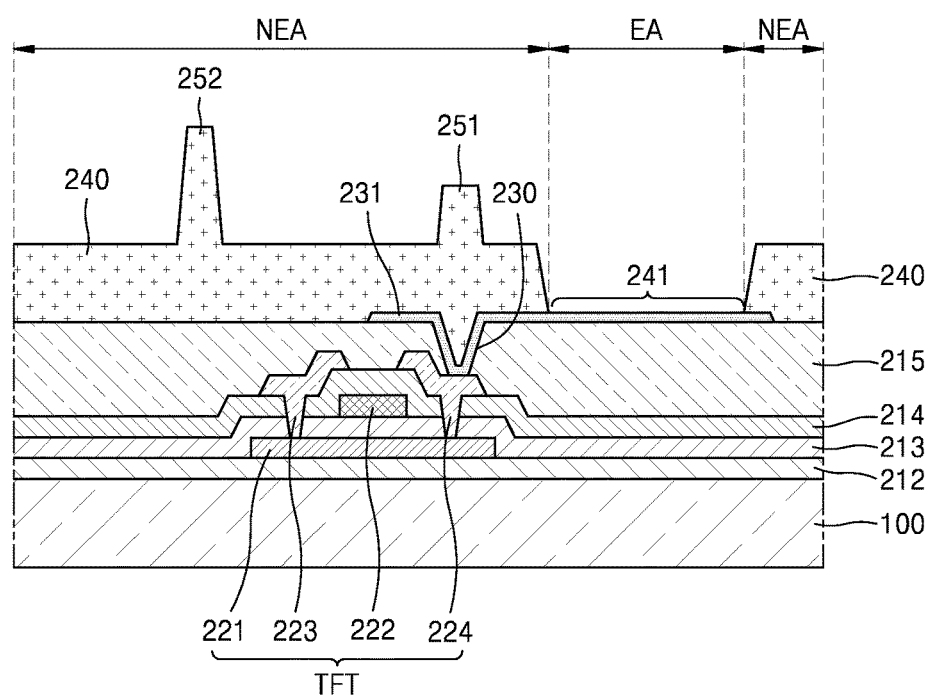

Referring to FIG. 7, a process of developing the pixel-defining film forming layer 239 may be performed. An area of the pixel-defining film forming layer 239, the material characteristic of which has been changed through the exposure process described above, may be removed from or remain on the first substrate 100 after undergoing a developing process. When the pixel-defining film forming layer 239 is a positive resist, an area of the pixel-defining film forming layer 239 corresponding to the complete exposure unit 310 of FIG. 6 may be completely removed so as to form the opening 241. As described above, an organic emission layer may be disposed in the opening 241, and thus the emission area EA may be defined. An area of the pixel-defining film forming layer 239 corresponding to the partial exposure unit 320 of FIG. 6 may be removed up to the predetermined depth, and thus the remaining area may remain as the pixel-defining film 240 on the first substrate 100. The pixel-defining film 240 may be formed in the non-emission area NEA surrounding the emission area EA.

Meanwhile, the area of the pixel-defining film forming layer 239 corresponding to the non-exposure unit 330 of FIG. 6 and located directly below the dent area DA of FIG. 5 may remain on the first substrate 100 to form the first spacer 251. An area of the pixel-defining film forming layer 239 corresponding to the non-exposure unit 330 of FIG. 6 and excluding the area directly below the dent area DA may form the second spacer 252 that is higher than the first spacer 251. The first spacer 251 and the second spacer 252, like the pixel-defining film 240, may be formed in the non-emission area NEA.

Figure 8:
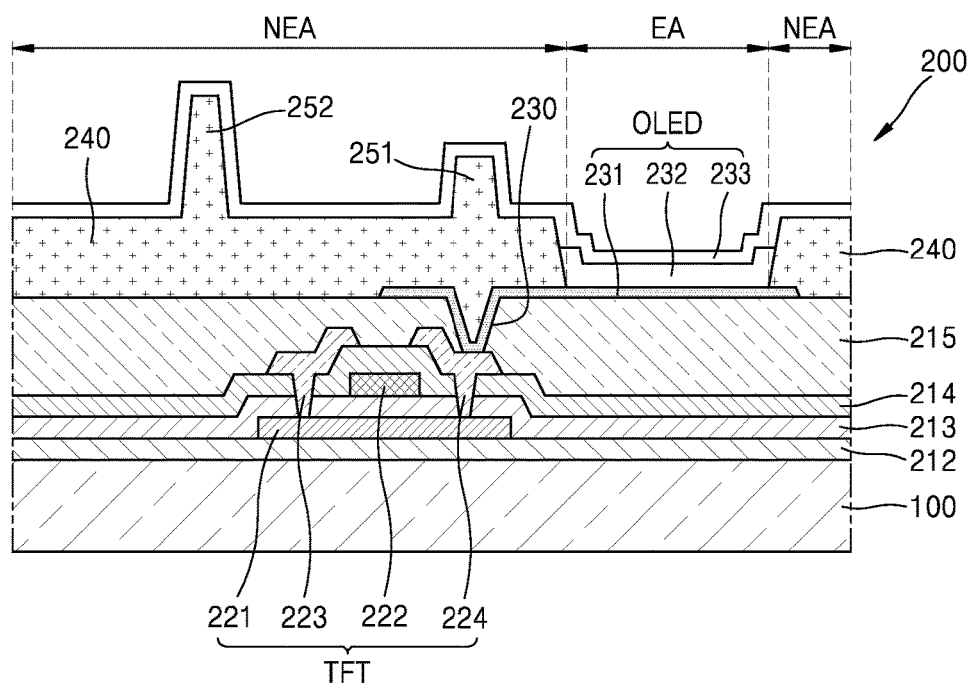

Referring to FIG. 8, the intermediate layer 232 and the opposing electrode 233 may be sequentially formed on the pixel electrode 231. Thus, the OLED including the pixel electrode 231, the intermediate layer 232, and the opposing electrode 233 may be formed. Although not shown in FIG. 8, a capping layer may be further formed on the opposing electrode 233 to protect the opposing electrode 233.

The opposing electrode 233, disposed facing the pixel electrode 231, may be a transparent or semi-transparent electrode, and may be formed of a metal thin film with a low work function, such as Li, Ca, LiF/Ca, LiF/Al, Al, Ag, Mg, or a combination thereof. For another example, an auxiliary electrode layer or a bus electrode may be further formed on the metal thin film by using a material for forming a transparent electrode, e.g., ITO, IZO, ZnO, $In_2O_3$, or the like. The opposing electrode 233 may be formed over the entirety of the first substrate 100, and may be formed of a material having a predetermined reflectivity.

Thus, the opposing electrode 233 may allow light emitted from an organic emission layer (not shown) included in the intermediate layer 232 to pass through in a direction toward the second substrate 110 of FIG. 1. That is, the light emitted from the organic emission layer (not shown) may be reflected directly or via the pixel electrode 231 which is a reflective electrode, and may be emitted toward the opposing electrode 233.

However, the organic light-emitting display device 1000 of the present embodiment is not limited to a top emission-type display device, and may be a bottom emission-type display device in which the light emitted from the organic emission layer (not shown) is emitted toward the first substrate 100. In this case, the pixel electrode 231 may be a transparent or semi-transparent electrode and the opposing electrode 233 may be a reflective electrode. The organic light-emitting display device 1000 of the present embodiment may be a dual emission type in which light is emitted in both directions of front and bottom surfaces thereof.

Meanwhile, the pixel-defining film 240 may be formed on the pixel electrode 231 and the protection film 215. The first spacer 251 and the second spacer 252 having different heights may be formed on the pixel-defining film 240. The pixel-defining film 240 may expose a predetermined region of the pixel electrode 231, and the intermediate layer 232 with the organic emission layer is present on the exposed region of the pixel electrode 231.

The organic emission layer (not shown) included in the intermediate layer 232 may include a low molecular weight organic material or a high molecular weight organic material. The intermediate layer 232 may selectively further include a functional layer such as a hole transport layer (HTL), a hole injection layer (HIL), an electron transport layer (ETL), an electron injection layer (EIL), etc.

In this regard, the low molecular weight organic material may include copper phthalocyanine (CuPc), N,N'-Di(naphthalene-1-yl)-N,N'-diphenyl-benzidine (NPB), tris-8-hydroxyquinoline aluminum (Alq3), etc. that may be formed through vacuum deposition using a mask.

When the intermediate layer 232 includes the high molecular weight organic material, the intermediate layer 232 may have a structure including the HTL and the EML. In this regard, the HTL may include polyethylenedioxythiophene, and the organic emission layer may include a polyphenylenevinylene (PPV) or polyfluorene material.

The organic emission layer may emit light of a color selected from red, green, and blue colors. For another example, the organic emission layer may emit a white light. The organic light-emitting display device 1000 may further include color filter layers of red, green, and blue colors so as to output images of various colors.

The cross-sectional views of FIGS. 2 through 8 are exemplary, and a structure of the display unit 200 according to the exemplary embodiments may be modified in various ways depending on designs.

As described above, according to the one or more of the above exemplary embodiments, an organic light-emitting display device may enhance its strength against external shock.

According to one or more of the above exemplary embodiments, an organic light-emitting display device may prevent a display image from being stained by a part of a deposition material being transferred onto an encapsulation substrate.

According to one or more of the above exemplary embodiments, an organic light-emitting display device may form layers of various thicknesses through a single mask process.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and detail may be made therein without departing from the spirit and scope as defined by the following claims.

What is claimed is:

1. An organic light-emitting display device, comprising:
    a substrate;
    a thin film transistor (TFT) disposed on the substrate;
    a protection film disposed on the substrate so as to cover the TFT, and comprising a hole;
    a pixel electrode disposed on the protection film so as to cover an inner surface of the hole, and electrically connected to the TFT;
    a pixel-defining film disposed on the pixel electrode and the protection film, and an opening in the pixel-defining film; and
    first and second spacers disposed on the pixel-defining film;
    wherein the first spacer is disposed so as to correspond to the hole, and a height of the second spacer is higher than a height of the first spacer and
    wherein portions of the pixel-defining film external to each of the first and second spacers have a first thickness that is less than second and third thicknesses of the pixel-defining film at locations corresponding respectively to the first and the second spacers but greater than any thickness of the pixel-defining film at a location corresponding to that of the opening, wherein each of the first and second spacers are spaced-apart from the opening by at least one of the portions of the pixel-defining film external to each of the opening and the first and second spacers.

2. The organic light-emitting display device of claim 1, wherein the first spacer is disposed directly above the hole.

3. The organic light-emitting display device of claim 1, wherein the first spacer has an island shape.

4. The organic light-emitting display device of claim 1, wherein the first and second spacers comprise the same material as a material of the pixel-defining film, and are integrated with the pixel-defining film.

5. The organic light-emitting display device of claim 1, wherein each of the first, second and third thicknesses are measured from a bottom surface of the pixel defining film to respective corresponding top surfaces of the pixel defining film, the first spacer, and the second spacer.

6. The organic light-emitting display device of claim 1, wherein the pixel-defining film and the first and second spacers comprise an organic material.

7. A method of manufacturing an organic light-emitting display device, the method comprising:
    preparing a substrate;
    forming a thin film transistor (TFT) on the substrate;
    forming a protection film on the substrate to cover the TFT;
    forming a hole in the protection film to expose a part of the TFT;
    forming a pixel electrode on the protection film to cover an inner surface of the hole, and electrically connecting the pixel electrode to the TFT through the hole;
    forming a pixel-defining film forming layer on the substrate to cover the pixel electrode and the protection film;
    exposing the pixel-defining film forming layer using a halftone mask; and
    developing the exposed pixel-defining film forming layer, forming a pixel-defining film perforated by an opening that exposes a part of the pixel electrode, and forming first and second spacers on the pixel-defining film;
    wherein the forming of the first and second spacers comprises: forming the first spacer in an area corresponding to the hole in the protection film, and forming the second spacer so as to have a height higher than a height of the first spacer and
    wherein portions of the pixel-defining film external to each of the first and second spacers have a first thickness that is less than second and third thicknesses of the pixel-defining film at locations corresponding respectively to the first and the second spacers but greater than any thickness of the pixel-defining film at a location corresponding to that of the opening, wherein each of the first and second spacers are spaced-apart from the opening by at least one of the portions of the pixel-defining film external to each of the opening and the first and second spacers.

8. The method of claim 7, wherein the first spacer is disposed directly above the hole in the protection film.

9. The method of claim 7, wherein the first spacer has an island shape.

10. The method of claim 7, wherein the pixel-defining film forming layer comprises a dent area having a sunken surface.

11. The method of claim 10, wherein the dent area is disposed directly above the hole.

12. The method of claim 7, wherein the pixel-defining film forming layer comprises an organic material.

13. The organic light-emitting display device of claim 5, wherein the pixel-defining film and the first and second spacers comprise photoresist and are produced by a photolithographic technique using a half-tone mask.

* * * * *